United States Patent [19]

Stern et al.

[11] 4,055,758

[45] Oct. 25, 1977

[54] SURFACE WAVE DEVICES FOR PROCESSING SIGNALS

[75] Inventors: Ernest Stern, Concord; Richard C. Williamson, Framingham; Abraham Bers, Arlington; John H. Cafarella, Swampscott, all of Mass.

[73] Assignee: Massachusetts Institute of Technology, Cambridge, Mass.

[21] Appl. No.: 672,345

[22] Filed: Mar. 31, 1976

Related U.S. Application Data

[62] Division of Ser. No. 555,367, March 5, 1975, Pat. No. 4,016,412.

[51] Int. Cl.² .................. G06G 7/19; H04R 17/00
[52] U.S. Cl. .................. 364/821; 310/313; 330/295; 340/173 PP; 364/861
[58] Field of Search ............. 235/181; 333/30 R, 72; 310/8.1; 340/173 R, 173 MS, 173 PP, 173.2

[56] References Cited

U.S. PATENT DOCUMENTS

| 3,760,172 | 9/1973 | Quate | 235/181 |
| 3,826,932 | 7/1974 | Wang | 310/8.1 |
| 3,833,867 | 9/1974 | Solie | 235/181 |
| 3,862,431 | 1/1975 | Quate et al. | 310/8.1 |
| 3,886,529 | 5/1975 | Bert et al. | 333/30 R |
| 3,935,564 | 1/1976 | Quate et al. | 340/173 R |

OTHER PUBLICATIONS

Fahrner et al., Properties of a Single-Level Surface State Induced by Be Implantation into Si—SiO₂ Interfaces, J. of Appl. Physics, vol. 44, No. 2, Feb., 1973.
Bers et al., Surface State Memory in Surface Acoustoelectric Correlator, Applied Physics Letters, vol. 25, No. 3, Aug. 1974, pp. 133–135.
Schroder et al., Experimental Confirmation of the Fowler-Nordheim Law for Large-Area Field Emitter Arrays, Applied Physics Letters, vol. 23, No. 1, July 1973, pp. 15, 16.
Fanet et al., Charge Storage in SiO₂ Under Low-Energy Electron Bombardment, Applied Physics Letters, vol. 25, No. 4, Aug. 1974, pp. 183–185.

*Primary Examiner*—Felix D. Gruber
*Attorney, Agent, or Firm*—Arthur A. Smith, Jr.; Martin M. Santa; Robert F. O'Connell

[57] ABSTRACT

A continuously programmable matched filter device using a piezoelectric substrate capable of propagating acoustic wave signals on a selected surface thereof and a semiconductor substrate mounted adjacent and spaced from such surface. Means are provided for altering the conductivity pattern in the semiconductor substrate in accordance with the wave form of a reference wave signal so that a representation of the reference wave is effectively stored therein. Storage of the reference is achieved with electrostatic charge by supplying a plurality of electrons in the spatial region between the substrates or by manipulating the carriers in the semiconductor material into trapping states in order to produce such altered conductivity pattern. A second signal can thereupon be propagated along the piezoelectric substrate to interact with the stored reference conductivity pattern to provide either correlation or convolution operation depending on the direction of propagation thereof along the piezoelectric surface.

6 Claims, 12 Drawing Figures

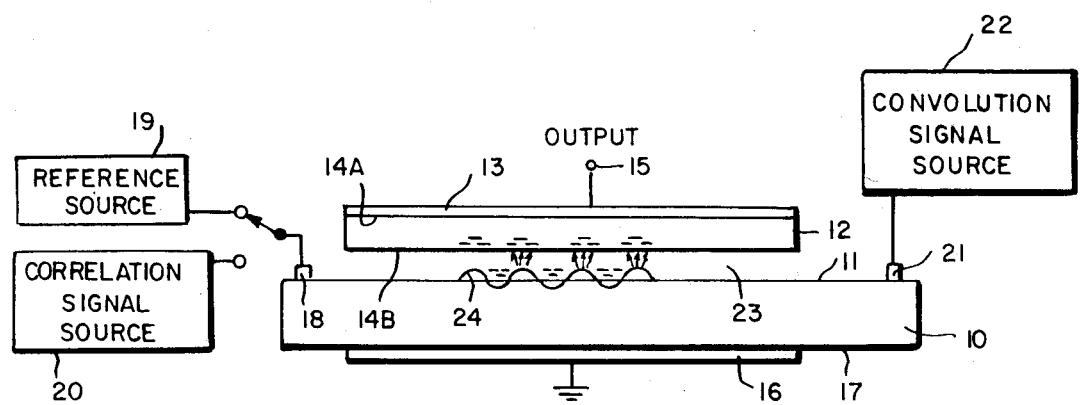
FIG. 1
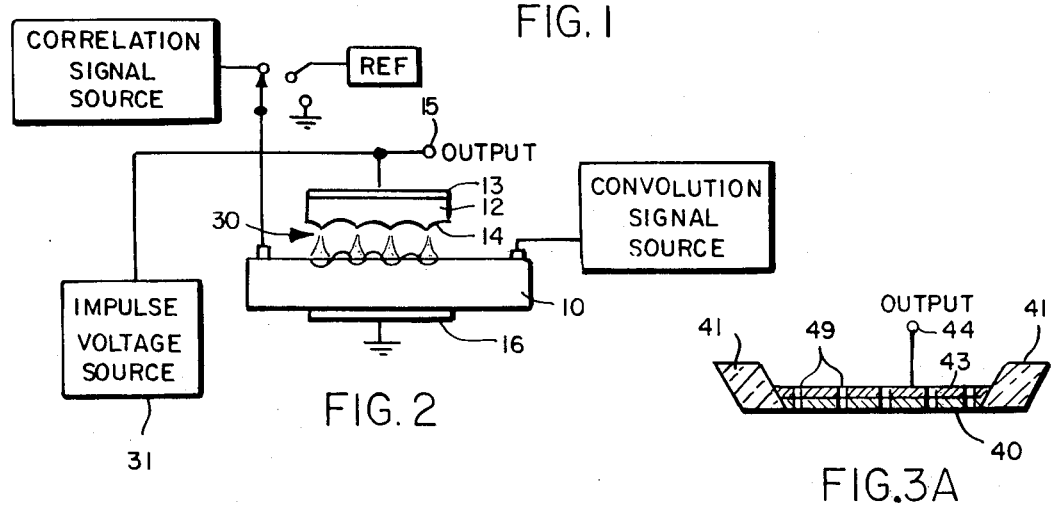
FIG. 2
FIG. 3A
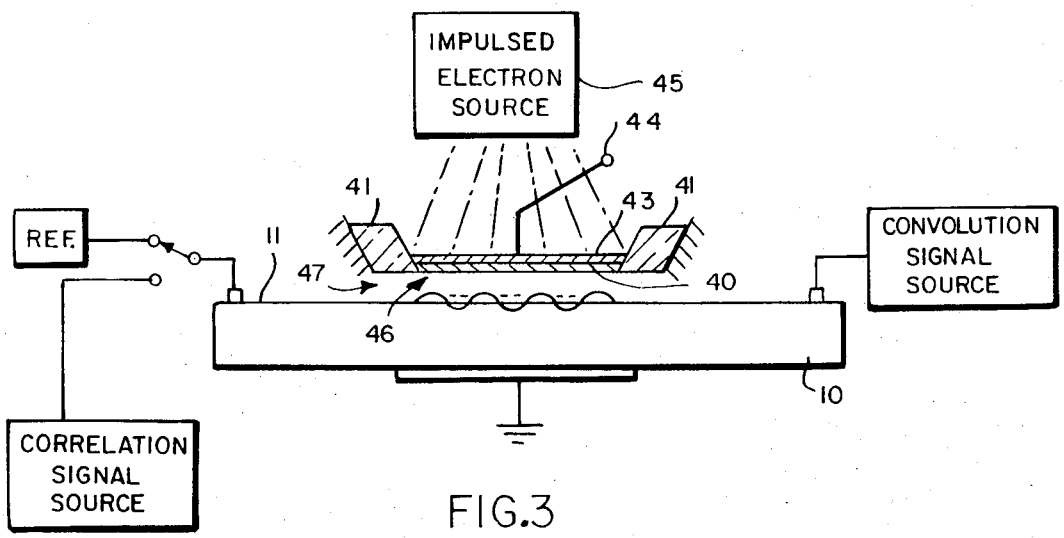
FIG. 3

SURFACE WAVE DEVICES FOR PROCESSING SIGNALS

This invention has resulted from work performed under contract with the U.S. Air Force.

This is a division of application Ser. No. 555,367, filed Mar. 5, 1975 now U.S. Pat. No. 4,016,412.

INTRODUCTION

This invention relates generally to surface wave devices for processing of signals and, more particularly, to the use of such devices as adaptive, or programmable, correlators and convolvers as well as memory storage devices.

BACKGROUND OF THE INVENTION

In many applications, for example, in the communications or radar fields it is desirable to provide devices for identifying the characteristics of incoming signals, particularly with respect to the characteristics of a reference signal. Such devices act as matched filters for such purposes. Moreover, it is desirable that such filter devices be adaptive in the sense that changes in the characteristics of the reference signal can be readily made and the filter thereby adapted to identify incoming signals with respect to the changed characteristics.

Certain techniques, such as the utilization of digital computer processing, have been used to provide appropriate adaptive matched filtering operation so that an appropriate correlation between an incoming signal and a reference signal to provide a matched filter output is achieved. Such techniques provide what is often called adaptive, or programmable, correlation. Up to the present time, however, no one has designed a surface wave device for providing a continuously programmable correlator operation unrestricted except by correlation time and bandwidth, despite the obvious need for such devices in many applications. Such devices can be contrasted with delay line devices using discrete switchable taps, which devices are programmable only at discrete points as described in the article of Hagon et al., "Integrated Programmable Analog Matched Filters for Spread Spectrum Applications", 1973 Ultrasonics Symposium Proceedings, IEEE, New York, N.Y. pp. 333-335.

DESCRIPTION OF THE PRIOR ART

The use of surface wave devices as convolvers has been suggested, for example, by Kino G.S., et al. in their article "Parametric interactions of Rayleigh waves", 1972 Ultrasonics Symposium Proceedings, IEEE, New York, N.Y., pp. 285-287, and in the article of Smith et al., "Surface Acoustoelectric Convolvers", 1973 Ultrasonics Symposium Proceedings, IEEE, New York, N.Y., pp. 142-144. In such convolvers a piezoelectric substrate such as quartz or lithium niobate (LiNbO$_3$) having a reference input at one end and a signal input at the other supports surface waves thereon which are applied at such inputs. A semiconductor material is placed adjacent, but spaced from, the surface of the piezoelectric substrate on which the surface waves are generated. The propagating electric field pattern associated with a first wave which travels along the surface of the piezoelectric material tends to bunch the electrons in the adjacent semiconductor and alters the local conductivity thereon accordingly. If a second surface wave is launched so as to propagate in the opposite direction from the other end of the piezoelectric material, the electric fields of the second wave interact with the bunched electrons to produce a local oscillatory current which is proportional to the product of the local amplitudes of the two signals. A summing electrode disposed on the back surface of the semiconductor integrates the product currents in the semiconductor over the interaction interval and, accordingly, the output from the electrode is proportional to the convolution of the two surface wave signals.

Thus, if the first signal $S_1(t)$ is interacted with the second signal $S_2(t)$ the convolver output provides an approximate solution to the convolution integral as follows:

$$\int_{t_1}^{t_2} S_1(\tau) S_2(2t - \tau) d\tau$$

This solution differs from true convolution because of the factor of 2 time compression which results from the fact that the signals being correlated are traveling past each other in opposite directions and because the response is restricted to the fact that signals must be present simultaneously.

While such devices that have been suggested approximate convolver operation, they are not easily adaptable for use as correlators. An approximate solution to the correlation integral can be obtained provided the signal $S_2(t)$ is the time-reverse of the $S_R(t)$ signal with which the signal $S_1(t)$ is to be correlated as shown below.

$$\int_{t_1}^{t_2} S_1(\tau) S_R(\tau - 2t) d\tau$$

In accordance with the invention, it is recognized that such a surface wave device can be utilized as a correlator if the reference wave signal can be held stationary (i.e., a representation thereof can be stored) and the input signal to be matched thereto is introduced in the same direction as the reference signal. Accordingly, the invention provides a structure wherein the reference can be appropriately stored (i.e., held stationary) during the correlation operation, and the true correlation is obtained $$\int_{t_1}^{t_2} S_1(\tau) S_2(\tau - t) d\tau$$

One method for storing information on a surface wave device to provide an effective acoustoelectric memory has been suggested by A. G. Bert et al. in the article "Signal Processing by Electrons being Interacted with piezoelectric surface waves", IEEE TRANS. 1973, S.U. -20, pp. 173-180. In such a memory device a surface acoustic wave is propagated along the surface of a piezoelectric substrate, such as quartz or lithium niobate. An electron source appropriately positioned with respect to the surface of the piezoelectric substrate provides an intense burst of electrons which impinges on the substrate surface and creates, or generates, low energy secondary electrons which migrate to the positive poles created by the presence of the traveling wave and remain on the insulating surface even after the wave continues its propagation along the piezoelectric surface. If a number of electrons sufficient to neutralize the polarization charge is obtained in an electron burst whose duration is short compared to the period of the traveling surface wave, then the residual stationary electrostatic fields will be equal in magnitude and opposite in sign to the fields of the surface wave at the time of the burst so that the characteristics of the surface wave are effectively stored on the surface of the piezoelectric material.

Unfortunately, it is not readily possible to use the storage techniques of the Bert et al. structure in the previously known convolver configurations in order to adapt the latter for use as correlators. In the prior known convolver structures the semiconductor material and its summing electrode must be placed so close to the surface of the piezoelectric substrate that the electron source of the Bert et al. memory device simply cannot provide sufficient electrons in the region of the gap therebetween to produce the necessary residual electric fields required for signal storage.

This invention provides a correlator in which, in certain embodiments thereof, suitable means are utilized to provide sufficient electrons on the piezoelectric surface to produce residual stationary electrostatic fields which extend to or partially into the semiconductor substrate, thereby resulting in an altered conductivity pattern in the semiconductor material. In certain other embodiments thereof, suitable means are utilized to provide appropriate manipulation of the carriers present in the semiconductor substrate in order to provide also an altered conductivity pattern in the semiconductor material. In both cases the storage mechanism produces an altered conductivity pattern which provides for the storage of a wave form pattern representing a reference signal which has been applied to the piezoelectric substrate. The reference wave form pattern which is so stored can then be used to provide a correlation operation through its interaction with a second signal which is applied subsequently at the same input as the reference signal input. The interaction of the input signal with the stored reference signal produces at the summing electrode of the semiconductor substrate a signal which is the true real-time correlation of the applied signal and the reference signal. Such correlation output signal can be obtained so long as the altered conductivity pattern in the semiconductor substrate representing the reference wave form persists. The stored wave form can be appropriately removed in the case where electrons have been provided in the gap region by generating sufficient electrons in the absence of a surface wave on the piezoelectric material so as to cancel the stored pattern and in the case where carriers are manipulated in the semiconductor material by the application of an appropriate bias to the semiconductor substrate to establish a substantially uniform conductivity pattern thereby removing the altered conductivity pattern therein. The removal of the stored reference wave form then permits a new signal representing a different reference signal to be stored.

If a signal is applied to the piezoelectric substrate at the opposite end thereof, i.e., at the convolver input, the interaction between the acoustic wave which is so generated by such signal and the altered conductivity pattern representing the stored reference wave produces at the summing electrode a signal which is the true real-time convolution of the applied signal with the reference signal.

In alternative embodiments of the invention the means for providing the residual electrostatic charge therein can utilize various and appropriate electron sources, such as field emitting sources positioned in the gap, semiconductor thin film membranes used together with appropriate external electron sources, or photoemission devices, all as described in more detail below. A particular technique for providing an appropriate manipulation of the carriers in the semiconductor substrate utilizes the traps in the semiconductor material. Altering the density of filled traps in accordance with the reference wave form produces spatial charge patterns therein, in accordance with the reference signal, so as to create in turn a conductivity pattern representative of the reference wave signal, as also described in more detail below.

The invention can be more clearly understood with the help of the drawings wherein:

FIG. 1 shows one embodiment of the invention illustrating the principles of operation for providing a correlation (or convolution) operation;

FIG. 2 shows a specific embodiment of the invention using field emitting devices;

FIGS. 3 and 3A show alternative embodiments of the invention using a thin film membrane;

Figure 4:
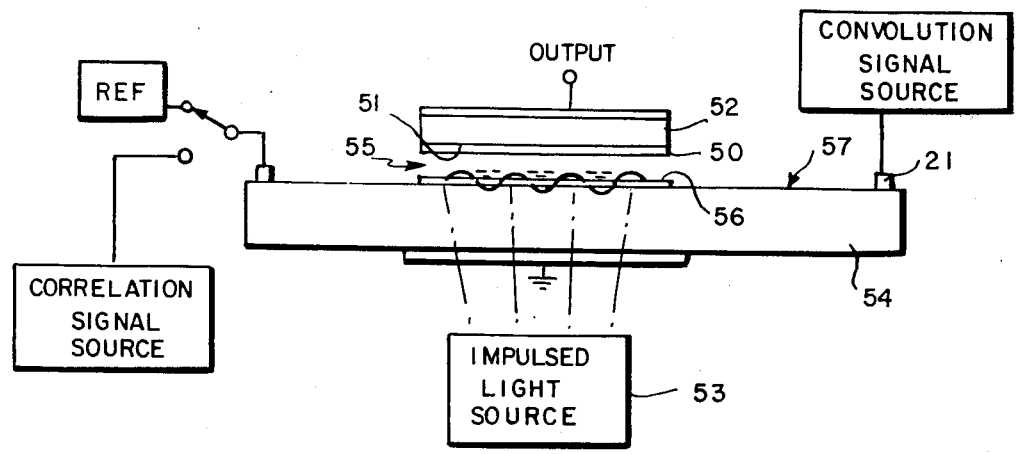
FIG. 4 shows an alternative embodiment of the invention using photoemissive material.

A particular embodiment of the invention for providing correlation (or convolution) operations utilizing the technique of establishing electric fields in the gap region and in the semiconductor material is shown in FIG. 1 wherein a piezoelectric substrate 10, such as a lithium niobate ($LiNbO_3$) substrate, has mounted adjacent a surface 11 thereof a semiconductor substrate 12, such as a silicon substrate. A summing electrode 13 in the form of a layer of conductive material is placed on the surface 14A of the semiconductor substrate 12 which is opposite to the surface 14B that is disposed adjacent surface 11 of the piezoelectric substrate. An output terminal 15 is connected to summing electrode 13 and the piezoelectric substrate is grounded by an appropriate conductive electrode 16 in the form of a layer of metal, for example, disposed on surface 17 thereof. An input transducer 18 is positioned at the surface 11 of piezoelectric substrate 10 at one end thereof so as to permit the generation of an acoustic wave signal along the surface thereof upon the application thereto of an electrical signal. Such electrical signal may be from a reference source 19 or from a correlator signal input source 20 via a switch, as shown. A second transducer 21 can be disposed at the other end of piezoelectric substrate 10 for use in applying a convolver input signal from a signal source 22.

A short burst of a sufficient number of low energy electrons is provided in the region of the gap 23 between surfaces 11 and 14B of the substrates 10 and 12, respectively, at the time when a reference input signal which has been applied at transducer 18 is present under the semiconductor substrate. At such time the acoustic wave representing the reference signal produces associated electric field patterns in the gap 23 and in the region of the semiconductor substrate adjacent thereto. The low energy electrons in the gap migrate to the positive poles formed by the acoustic wave on the piezoelectric substrate surface where they then remain, while the acoustic wave continues its travel to the end of the piezoelectric substrate where its energy is dissipated. The electrostatic charge pattern produces residual electrostatic fields in gap 23 and in the semiconductor material which are equal in magnitude and opposite in sign to the field of the surface wave. Such residual fields in turn produce an altered conductivity pattern in the semiconductor substrate, such altered conductivity pattern thereby being a stored representation of the wave form of the reference acoustic wave pattern present on the surface of the piezoelectric substrate at such instant of time, as shown by the exaggerated wave form 24 in FIG. 1.

Once the reference wave form has been so stored, an input signal from correlator input signal source 20 can be applied to transducer 18 so as to propagate an acoustic wave representing such input signal along the surface 11 of piezoelectric substrate 10. The electric field associated with the surface wave so propagated interacts with the conductivity pattern in the semiconductor material which represents the stored reference wave. An output signal is thereupon obtained at the output terminal 15 of the summing electrode 13, such signal representing the real-time correlation of the input signal from source 20 with the stored reference signal. Accordingly, the overall device acts as a continuous adaptive matched filter because a real-time continuous correlation is obtained for so long as the stored pattern of the reference wave form persists.

One means for providing appropriate electron bursts in the gap 23 is by the use of field emitting devices which can be disposed on the surface 14 of semiconductor substrate 12. An array of field emitting devices has been suggested for use in other contexts by Schroder et al. in their article "Experimental Confirmation of the Fowler-Nordheim Law for Large Area Field Emitting Rays", Appln. Phys. Lett. 1973, 23, pp. 15–16. In accordance with the invention, an appropriate array 30 of such field emitters is disposed on the surface 14 of semiconductor substrate 12 and impulse voltage from source 31 is applied thereto via summing electrode 13. The application of a pulsed DC voltage thereby produces bursts of electrons in the gap 23, as shown in FIG. 2.

An alternative embodiment for supplying electron bursts in the gap region is shown in FIG. 3 wherein a thin film membrane 40 of semiconductor material is appropriately mounted with its supporting frame 41 adjacent the upper surface 11 of the piezoelectric substrate 10, opposite the region where the signal storage takes place. A thin film of conductive material 43 is positioned as a coating on the back of the thin film membrane and acts as a summing electrode having an output terminal 44 connected thereto. An intense source 45 of electrons, such as an electron gun, or an array of field emitters, is used to supply a burst of relatively high energy electrons. The high energy electrons impinge upon the thin film membrane through the summing electrode so that a sizeable number of secondary electrons are thereby emitted from the surface 46 of the thin film membrane into the gap 47. In addition, a sizeable number of primary electrons from source 45 penetrate the membrane and are also present in gap 47. The high energy electrons which penetrate through membrane 40 impinge on the piezoelectric surface 11 and tend to cause additional secondary electrons to be emitted therefrom into gap 47. The high energy primary electrons as well as the secondary electrons from the semiconductor membrane and the piezoelectric substrate provide a sufficient number of the electrons within the gap so as to permit the storage action to take place.

An alternative embodiment of such a thin film membrane structure may be constructed to include an array of apertures 49 so as to form, for example, a lattice structure, the primary electrons from source 45 readily being permitted to pass through such apertures. Such a structure as shown in FIG. 3A permits a lower energy electron source to be utilized and also tends to avoid any substantial changes in the electrical characteristics of the semiconductor thin film membrane which may tend to appear in the structure of FIG. 3 when much higher energy electrons are forced to penetrate through the semiconductor material.

A further alternative embodiment of the invention for creating a burst of electrons in the gap between the piezoelectric substrate and the semiconductor material is shown in FIG. 4. As seen therein, a layer 50 of photoemissive material is disposed on the surface 51 of a semiconductor substrate 52. A suitable light source 53 is disposed below piezoelectric substrate 54 and can be appropriately activated to provide a source of photons which penetrate through the piezoelectric material to impinge upon the photoemissive coating 50 to cause the latter to emit photo-electrons into the gap 55. Alternatively, a coating, or layer, 56 of photoemissive material may be placed on the surface 57 of piezoelectric substrate 54 either instead of, or in addition to, the photoemissive layer on the semiconductor substrate. Sufficient electrons can be generated in an appropriate burst so as to permit the instantaneous storage of a reference signal wave form by activating the light source 53.

Figure 5:
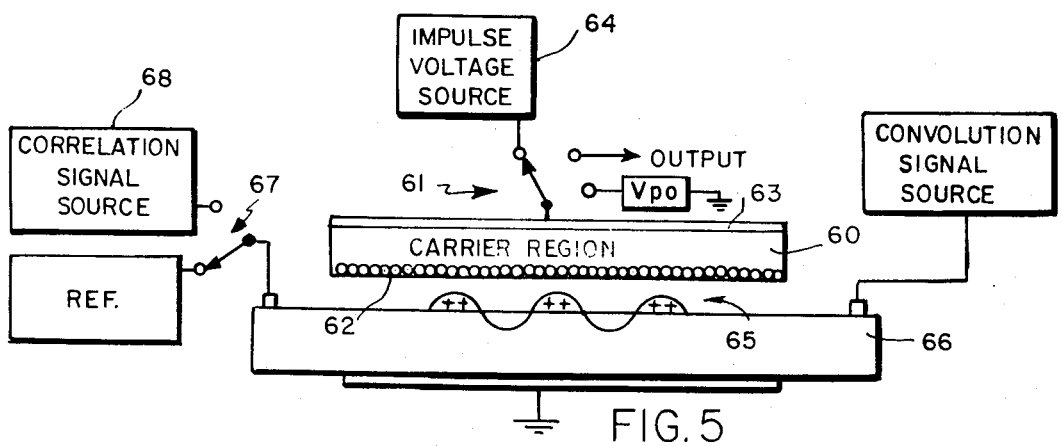
FIGS. 5, 5A and 5B show an alternative embodiment of the invention using semiconductor trap techniques.

Although the storage phenomenon is achieved through the generation of the electrons within the gap between the piezoelectric substrate and the semiconductor material in the embodiments of FIGS. 2 through 4, such storage can also be accomplished in an alternative manner without the need to generate such electron bursts. An alternative structure therefor is shown in FIG. 5 and makes use of the traps in the trap region which, as is well known, is present substantially at or near the surface of a semiconductor material, the manipulation of carriers present in the traps being used to produce an altered conductivity pattern in the semiconductor material for use as a memory for a surface acoustic wave signal which propagates along the adjacent piezoelectric substrate. In accordance with the operation thereof, a time independent spatial charge pattern representing the acoustic signal is created in the traps for producing the altered conductivity pattern as discussed below.

As is well-known, carriers present in a semiconductor material 60 can be retained in selective regions, or traps, 62 thereof over relatively long periods of time. The rate at which such traps are filled, or emptied, is proportional to the carrier density surrounding them. The region at or near the surface of the semiconductor material can be made to be substantially depleted of carriers if, for example, a suitable bias voltage is applied thereto, such as the voltage $V_{po}$ which can be, for example, a zero voltage (i.e., the semiconductor material is grounded), as shown by one position of switch 61.

Figure 5A:
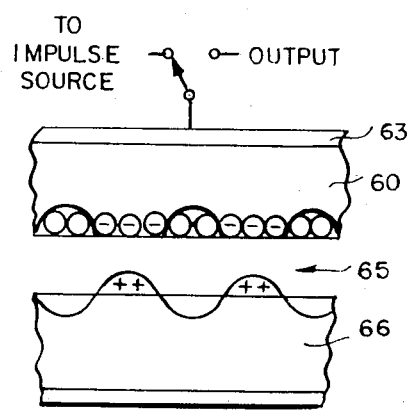
Figure 5B:
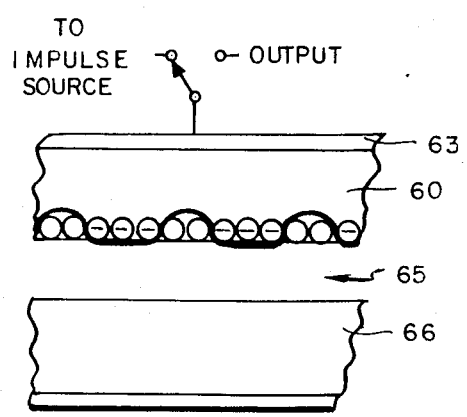

Once a reference acoustic signal applied via switch 67 and traveling on the surface of piezoelectric substrate 66 is in position under the semiconductor substrate 60, as shown in FIG. 5, a d-c impulse from impulse source 64 is applied to the semiconductor substrate 60 via switch 61. The application of the impulse voltage thereto together with the presence of the electric field established by the acoustic wave signal causes the carrier density to be relatively greater over the positive poles than over the negative poles as shown in FIG. 5A. Such condition in turn causes more traps to be filled over the positive poles than over the negative poles. When the d-c impulse is over, the region at and near the surface of the semiconductor substrate returns to its generally depleted state and the filled traps (i.e., the traps containing carriers) empty relatively slowly and the retention of carriers in the filled traps produce a spatial alteration in the conductivity pattern of the semiconductor material which provides the stored reference wave form as shown in FIG. 5B.

The selective spatial charge pattern in the traps and the corresponding altered conductivity pattern in the semiconductor material is of relatively long duration and the reference acoustic signal is thereby effectively stored. An input signal from source 68 applied to the piezoelectric material at the same end as the reference signal propagates along the surface thereof and interacts with the altered conductivity pattern representing the stored reference signal so that the signal at the output terminal of the summing electrode 63 provided via switch 61 is a real-time correlation signal, as desired.

In all of the particular embodiments discussed above, if a convolution operation is required, the signal which is applied to the piezoelectric substrate following the storage of the reference signal is applied at the convolution terminal end of the piezoelectric substrate so that the output signal at the summing electrode represents a real-time convolution signal.

In addition to providing correlation and convolution operation, the device of the invention can be used as a memory storage device by the storage of any appropriate signal in the manner as discussed above with respect to the storage of the reference wave form signal in the correlator or convolver application. In order to read out the stored signal, an acoustic impulse signal is applied at the convolver input terminal end of the piezoelectric substrate. The interaction of the impulse signal with the reference signal (in effect the stored signal is convolved with the impulse signal) provides a read-out of the stored signal at the output terminal of the semiconductor substrate. Alternatively, the stored signal can be read out in the opposite, or time-reverse, direction, if desired, by applying an acoustic impulse signal at the correlator terminal end of the piezoelectric substrate.

An an alternative to the above described storage processes, such processes can also be performed by applying an impulse voltage to an input transducer means of the piezoelectric substrate and either modulating the output of the electron source with the reference signal or applying such reference source directly to the conductive output electrode of the semiconductor substrate, as shown in FIGS. 6-9 effectively corresponding to FIGS. 2-5.

Figure 6:
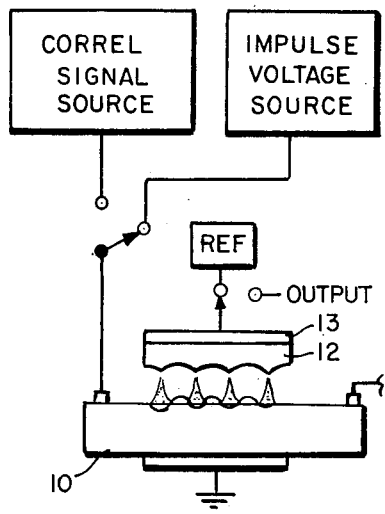
FIGS. 6-9 show alternative embodiments of the invention depicted in FIGS. 2-5.
Figure 7:
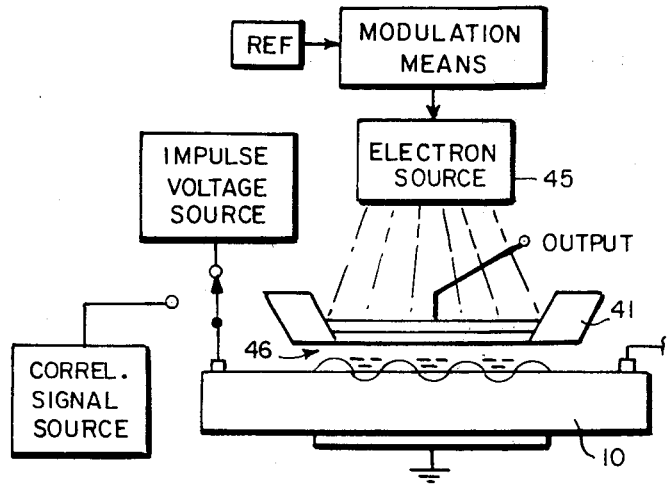
Figure 8:
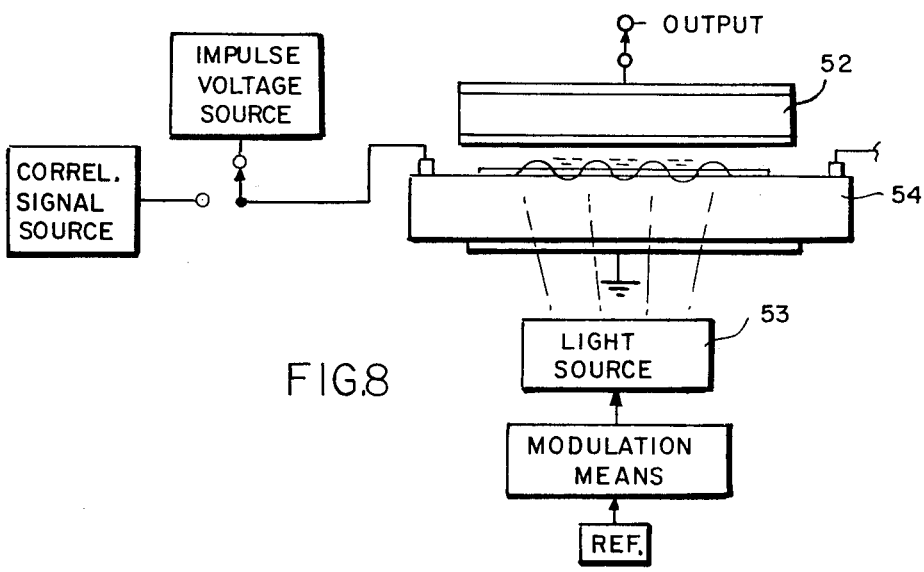
Figure 9:
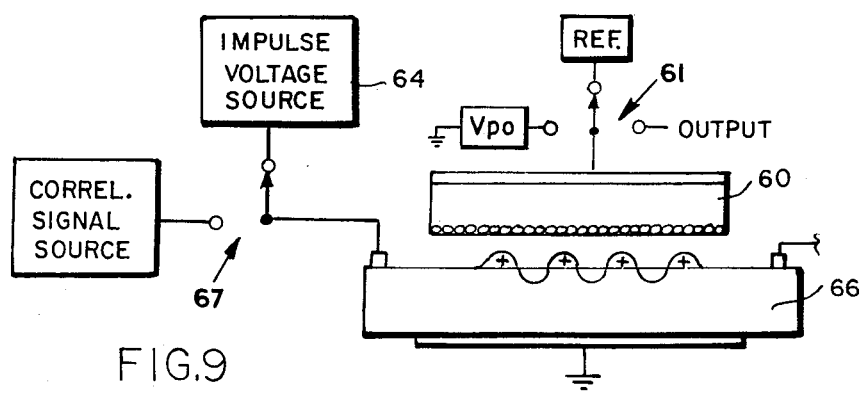

Thus, as shown in FIG. 6, the reference is supplied to the conductive electrode via an appropriate switch with an impulse applied to an input transducer from an impulse voltage source via an appropriate switch as shown. In FIG. 7 the reference signal is applied to a suitable modulation means which in turn appropriately modulates the supply of electrons from the electron source in accordance with the characteristics of the reference signal. An impulse signal is supplied to an input transducer from an impulse voltage source via an appropriate switch as shown. FIG. 8 shows a similar modulation technique wherein the output of the light source is modulated by the reference signal and an impulse signal is applied to an input transducer from an impulse voltage source via an appropriate switch, as shown. FIG. 9 shows the reference signal applied to the conductive output electrode of the semiconductor material via the reference position of switch 61 while an impulse signal is applied to an input transducer from an impulse voltage source via an appropriate contact of switch 67 as shown. In all cases it is possible thereby to alter the conductivity pattern of the semiconductor substrate in order to store the reference wave form as desired.

Techniques for producing the physical arrangement of the piezoelectric and semiconductor substrate combination so as to produce a desired gap, or spatial region, therebetween have been described in the art as for example, in the article "Surface Acoustoelectric Convolvers" by Smith et al., 1973 Symposium Proceedings, IEEE, New York, N.Y., pp. 142-144. The gap dimension will generally lie within the range from about 0.1 to 1.0 micrometers, the exact value in any particular application depending generally upon the frequency of operation of the device. Moreover, the gap dimension should be as uniform as possible, a typical exemplary gap dimension and tolerance therefor being, for example, 0.3 ± 0.02 micrometers.

While the particular embodiments of the invention specifically discussed above seem preferable at the present time, modification thereto may occur to those skilled in the art without departing from the spirit and scope of the invention. Hence, the invention is not to be construed as limited to the particular embodiments shown and described herein, except as defined by the appended claims.

What is claimed is:

1. A device for processing and storing signals comprising
    a first piezoelectric substrate capable of propagating acoustic wave signals on a selected surface thereof;
    at least one transducer means formed on said selected surface for generating surface acoustic waves traveling on said surface along a selected direction thereof in response to electrical signals;
    a semiconductor material positioned so as to have a first surface thereof adjacent and spaced from said selected surface of said first substrate, said semiconductor material including a carrier region having a plurality of carriers and a trap region having a plurality of traps substantially at or near said first surface, said trap region forming an interaction region at or near said first surface;
    a layer of conductive material disposed on a second surface of said semiconductor material, said layer forming an electrode;
    means for providing a first signal at said at least one transducer means to produce a first traveling acoustic wave signal along said selected surface of said first substrate; and
    means for applying a second signal to said semiconductor material to cause carriers therein to migrate from said carrier region to said trap region, the interaction of said first traveling acoustic wave signal with said carriers in said trap region thereby causing said carriers to fill said traps and to be retained therein in a selective stationary pattern thereby producing said altered stationary conductivity pattern in said semiconductor material as said first traveling acoustic wave signal travels along said selected surface of said first substrate, said altered stationary conductivity pattern being stored in said semiconductor material and representing the interaction of said first and second signals.

2. A device in accordance with claim 1 wherein said second signal applying means applies an impulse voltage to said semiconductor material at a preselected time.

3. A device in accordance with claim 1 and further including
means for providing a third signal at one of said at least one transducer means to generate a second traveling acoustic wave signal along said selected surface of said first substrate after said first signal has been stored;
whereby the interaction of said traveling second acoustic wave signal with said stored altered stationary conductivity pattern produces an output signal at said electrode.

4. A device in accordance with claim 3 wherein said third signal is provided at the same transducer means as that of said first signal, said second acoustic wave signal traveling in the same direction as said first acoustic wave signal whereby said output signal is a real-time correlation of said third signal with said altered stationary conductivity pattern.

5. A device in accordance with claim 3 wherein said third signal is provided at a different transducer means from that of said first signal for generating a second acoustic wave signal traveling in the opposite direction as that of said first acoustic wave signal whereby said output signal is a real-time convolution of said third signal with said altered stationary conductivity pattern.

6. A device for processing and storing signals comprising
a first piezoelectric substrate capable of propagating acoustic wave signals on a selected surface thereof;
at least one transducer means formed on said selected surface for generating surface acoustic waves traveling on said surface along a selected direction thereof in response to electrical signals;
a semiconductor material positioned so as to have a first surface thereof adjacent and spaced from said selected surface of said first substrate, said semiconductor material including a carrier region having a plurality of carriers and a trap region having a plurality of traps substantially at or near said first surface, said trap region forming an interaction region at or near said first surface;
a layer of conductive material disposed on a second surface of said semiconductor material, said layer forming an electrode;
means for providing a first signal;
means for applying said first signal to said semiconductor material to cause said carriers therein to migrate from said carrier region to said trap region;
means for supplying a pulse signal to one of said at least one transducer means for providing an acoustic signal traveling along said selected surface of said first substrate, the time duration of said pulse being selected so that said acoustic signal interacts with said carriers in said trap region thereby causing said carriers to fill said traps in a selective pattern in accordance with the selected characteristics of said first signal to provide an altered stationary conductivity pattern in said semiconductor material representing the wave form of said first signal whereby said first signal is stored in said device.

* * * * *